United States Patent
Hatley

(10) Patent No.: US 6,871,312 B2
(45) Date of Patent: Mar. 22, 2005

(54) METHOD AND APPARATUS FOR TIME STAMPING DATA

(75) Inventor: Tom Hatley, San Jose, CA (US)

(73) Assignee: Spirent Communications, Agoura Hills, CA (US)

(*) Notice: Subject to any disclaimer, the term of this patent is extended or adjusted under 35 U.S.C. 154(b) by 409 days.

(21) Appl. No.: 10/229,308

(22) Filed: Aug. 27, 2002

(65) Prior Publication Data

US 2004/0044941 A1 Mar. 4, 2004

(51) Int. Cl.$^7$ ............................................. H03M 13/00
(52) U.S. Cl. ................... 714/752; 714/758; 714/701; 714/776; 714/746
(58) Field of Search ............................. 714/752, 758, 714/776, 701

(56) References Cited

U.S. PATENT DOCUMENTS 6,477,181 B1 * 11/2002 Fujimori et al. ............ 370/476
6,680,944 B1 * 1/2004 Lym et al. .................. 370/394

* cited by examiner

Primary Examiner—Phung My Chung
(74) Attorney, Agent, or Firm—The Hecker Law Group Q PLC

(57) ABSTRACT

The invention discloses a method and apparatus for time stamping data packets under controlled conditions. Embodiments of the invention eliminate or minimize the error, caused in existing applications, by the elapsed time between the moment of a data packet generation and a the transmission of the data packet. Embodiments of the invention insert an initial data value, in lieu of the time stamp, into the data packet. Embodiments of the invention delay time stamp insertion to just prior to data transmission. A time stamp is inserted in time stamp location, and using a set of correction equations, embodiments of the invention generate a final error checking value that is attached to the data packet. Embodiments of the invention insert a precision time stamp into the data packet and apply a correction to the error checking value. At the end of the processing of the data packet, the latter contains a time stamp that has been introduced with a high precision, and has a correct error checking value.

33 Claims, 4 Drawing Sheets

METHOD AND APPARATUS FOR TIME STAMPING DATA

FIELD OF THE INVENTION

This invention relates to the field of computer technology. More specifically, the invention relates to a method and apparatus for timing network packets.

Portions of the disclosure of this patent document contain material that is subject to copyright protection. The copyright owner has no objection to the facsimile reproduction by anyone of the patent document or the patent disclosure as it appears in the Patent and Trademark Office file or records, but otherwise reserves all copyrights whatsoever.

BACKGROUND

Networks such as Ethernet and Token ring networks, carry information using packets of data. Each data packet is organized in accordance with a specific protocol and contains the data to be transmitted as well as the information (e.g., source and destination addresses) required to enable networking devices to properly route the data packet to its destination. Measuring network performance (e.g., transmission speed, response time and band-width) for data sent over a network requires tracking of the data carried by the network.

Existing systems for tracking network traffic rely on time stamping of network data packets. When a data packet traverses a given network node, the network node records the time of the traversal in the data packet. Some network devices store the time of traversal in a separate location and other devices store the time of traversal in the data packet, itself, before transmitting the data packet to other network nodes. When another network node receives the data packet, it is able to read the time stamp recorded in the data packet, or access the storage location to retrieve previously stored time data, and compare the time stamp or time data to a time reference, enabling the system to measure network data handling capabilities.

Although this time stamping technique is useful for tracking network data packets, it still faces a significant limitation when the load of data to be transmitted is high (e.g., in high-speed networks). Networking devices handling the data usually carry out multiple processing tasks on the data packets (e.g., time stamp verification and error checking). The error, relative to the correct time reference, increases as the amount of processing time increases. Furthermore, the error introduced by the processing is largely unpredictable.

Therefore, there is a need for time tracking methods that allow networking devices to maximize the accuracy of time stamping data in networks.

SUMMARY OF THE INVENTION

Figure 1:
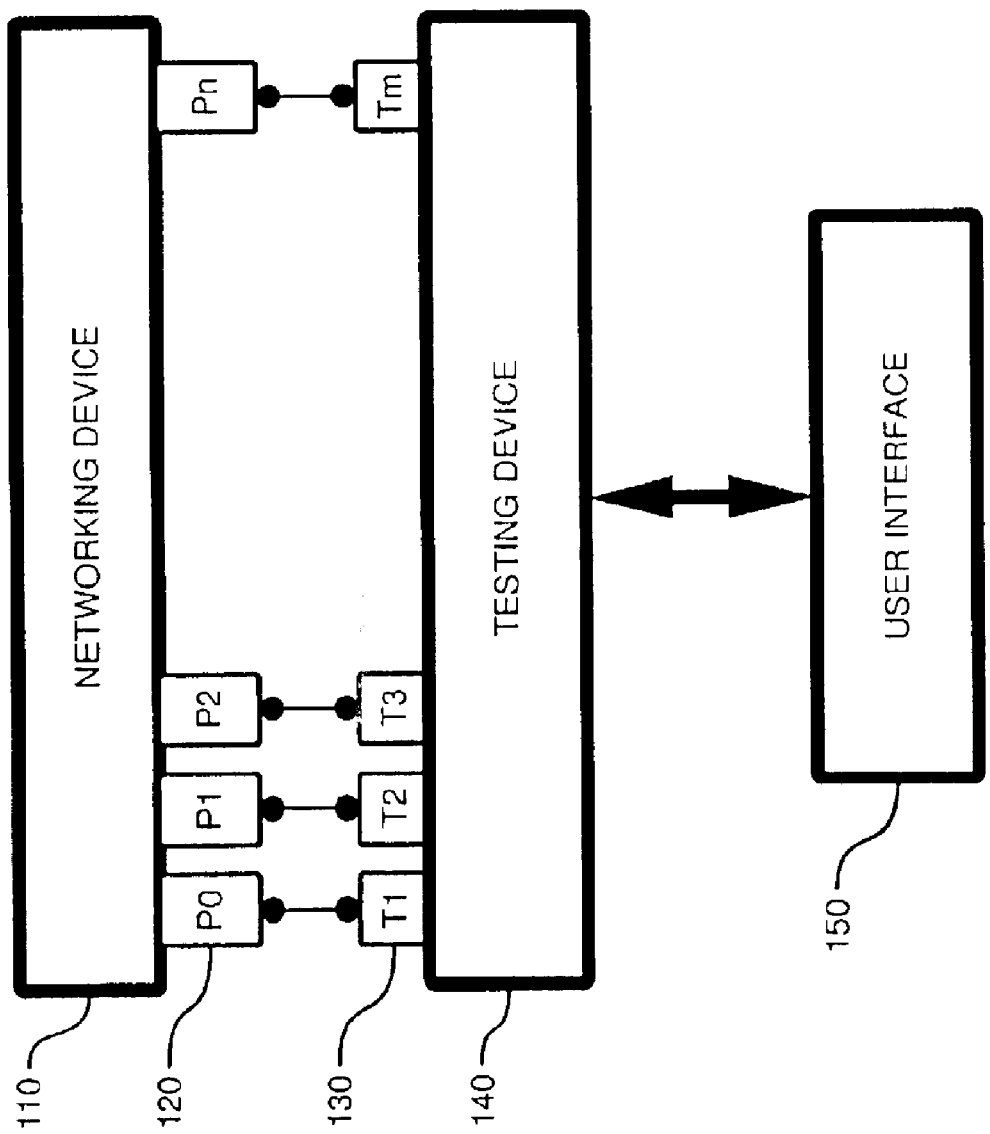
FIG. 1 is a block diagram illustrating a typical example of networking device performance testing using embodiments of the invention.

The invention is a method and apparatus for time stamping network data packets. Embodiments of the invention allow precise timing of network packets by inserting a time stamp in data packets at controlled points in time. Since the modification of any data in the packet induces an error relative to the error checking value attached to the packet, embodiments of the invention utilize an initial value (e.g., zero) that is inserted in the data packet in lieu of the time stamp, and a partial error correction value. The correct time stamp is inserted later just prior to the transmission of the packet, thus minimizing the error between the time stamp insertion and transmission. Embodiments of the invention utilize a set of correction equations to compute a final error checking value.

Embodiments of the invention insert the time stamp value in the third slot from the end of a data packet. In the second slot before the end of the data packet, a complement of the time stamp is inserted. The latter configuration allows embodiments of the invention, using the Frame Checking Sequence (FCS-32) technique, to use the time stamp and its complement to compute the last step of the FCS-32.

The insertion and correction of the time stamp are performed at controlled instants in time. For example, the correct timestamp is placed on the frame at the last possible moment before the frame is emitted, thus removing any variation in transit times that exist in the earlier parts of the transmit path. To control the precision of the time stamp, after the packet is received, a value of zero is inserted into the location of the time stamp and into the location of the timestamp complement.

An FCS-32 is then computed. Systems implementing the invention then insert a time stamp obtained from a time source, and its complement, into the packet. The systems execute a set of equations, using the time stamp value, to compute a correction value. The correction value is then combined with the previously computed FCS-32, using an exclusive-OR operation, to compute a final correct FCS-32 value for the frame in question.

Embodiments of the invention utilize a time stamp source module and a correction module that communicate with one or more data ports, providing a common source of time stamp and correction values shared between multiple data ports.

DETAILED DESCRIPTION

The invention is a method and apparatus for timing network data packets. In the following description numerous specific details are set forth in order to provide a more thorough understanding of the present invention. It will be apparent, however, to one skilled in the art, that the present invention may be practiced without these specific details. In other instances, well-known features have not been described in detail so as not to obscure the invention.

Throughout the disclosure, the description emphasizes the importance of the invention as implemented in systems that test the performance of networking devices. However, it is clear that the invention may be implemented in any situation that requires precise timing of network data. For instance, the invention may be carried out in any networking or communication device using software and/or hardware to time network data. The term network, as utilized herein, refers to a plurality of nodes. A node refers to any entity or computational device capable of processing data. Examples of nodes comprise computer systems equipped with at least with one central processing unit (CPU), random access memory, and hardwired electronics, such as network hubs and network interface cards. The network nodes may be connected in any configuration capable of allowing data to be transmitted between nodes. Communication links include any communication channel capable of carrying data, comprising wired networks, radio waves, optical carriers and any medium capable of conveying data from one node to another. An example of a network of several interconnected computers is the Internet.

FIG. 1 shows a block diagram that illustrates an example of a networking device that can be adapted to test network performance using embodiments of the invention. Networking devices 110 include devices capable of handling data transmitted over a network. Some well-known examples of such networking devices are switches, routers, hubs, and network interface cards. For example, a network switch (e.g., 110) typically contains a central processing unit (CPU), memory and one or more communication ports 120. Such network switches are capable of receiving packet data from data sources, such as workstations, servers and other networking devices, processing the packet data, and communicating it to a destination. The ultimate destination of the packet data may simply be encoded in the packet data itself or it may be determined according to configuration rules or context based rules. For example, a switch may be programmed to forward all connections using hypertext transfer protocol (HTTP) data to one or more destinations. Firewalls may elect to forward or block data packets. Networking devices may be very complex as they may combine one or more networking utilities. For example, network switches may also provide firewall capabilities. As these networking devices become more and more complex, testing the data transmission performance of such devices becomes increasingly difficult.

Embodiments of the invention may be implemented in a network testing device 140. Such network testing devices may include one or more ports 130, labeled T1, T2, T3 through Tm, to connect with the networking devices' ports 120, labeled P0, P1, P2 through Pn. The network testing system is typically equipped with a user interface unit 150 allowing a user to configure the testing apparatus and run equipment tests. Embodiments of the invention implemented in network testing systems provide the ability to precisely track the time when data packets, for example, enter and/or leave data ports into and/or out of the networking device 110. To this end, embodiments of the invention utilize a time reference, in combination with a method for inserting time stamps into data packets, that maximizes the time precision.

The network testing system is configured to connect with one or more ports of the networking device. Testing a networking device involves generating data, including data with errors, and running the data through the networking device. The network testing system may run on one or more ports simultaneously and/or load data in multiple data streams for each individual port. By labeling data packets with time stamps, systems implementing embodiments of the invention are capable of measuring the networking device's performance, such as response time and bandwidth.

Figure 2:
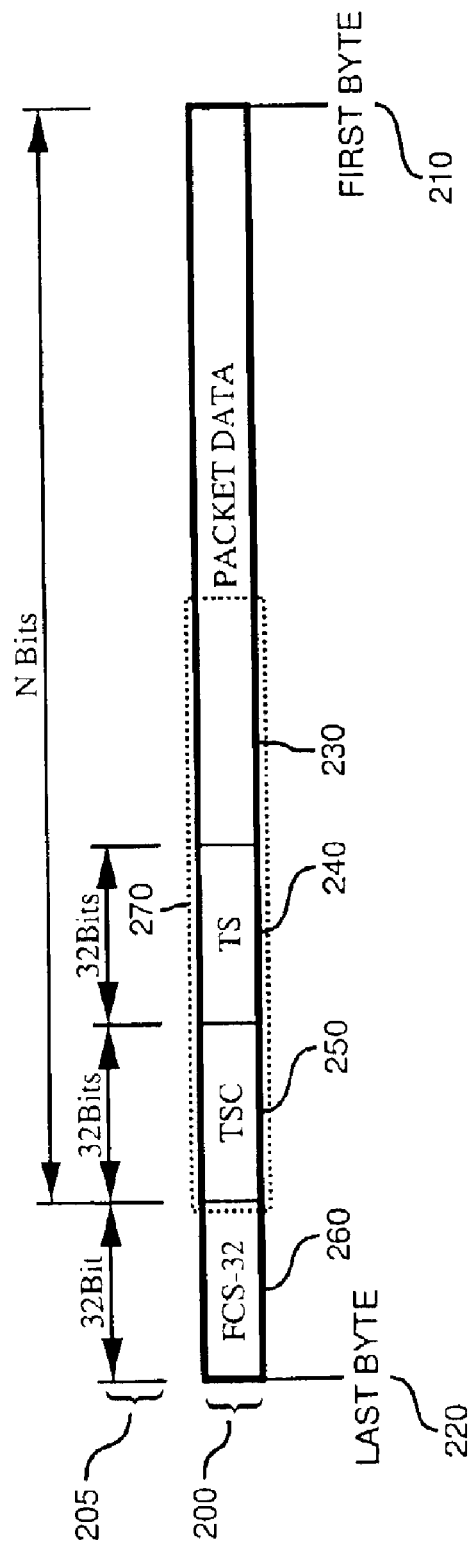
FIG. 2 is a block diagram illustrating network data packets, as used in embodiments of the invention.

FIG. 2 shows a block diagram illustrating data packets, as used in embodiments of the invention. A network data packet 200, also referred to as a frame, is a unit of data communicated through a communication channel. The layout of the data packet depends on the protocol used to represent the data. In FIG. 2, the data packet represented has a data region 270 and an error checking region 260. The data packet typically comprises a header portion, which contains traffic information, such as source and destination addresses, data ports, etc., and a data portion, containing the data to be transmitted between the data source and the destination. Embodiments of the invention may use a portion of the data packet's data portion to store data relevant to packet tracking and network performance, such as a time stamp. Most importantly, embodiments of the invention use a data portion capable of storing a time stamp 240. The time stamp location is also provided for any application designed to read the time at which the packet traversed a given node, for example. Other embodiments of the invention utilize two data portions 240 for storing a time stamp, and 250 for storing the complement of the time stamp. In FIG. 2, the first byte of the data packet is indicated by 210 and the last byte is indicated by 220. Region 260 indicates the Frame Checking Sequence (FCS-32). The scale bar 205 represents the size of different data segments in the data packet in accordance with one or more embodiments of the invention.

Data packets, in accordance with networking protocols, have a portion dedicated to error checking. Typically, when packets are generated, the data source computes a number based on the data contained in the data packet and appends it to the data packet. The receiving end applies the same computation to the data in the data packet and compares its result with the result stored by the source at the end of the data packet. If the stored value from the source is different from the newly computed value, then the data is considered to contain errors. A simple method of checking for errors consists of computing the checksum of the data in the data packet. Other methods utilize cyclic redundancy checking (CRC) to compute an error checking value. Cyclic redundancy checking is a method for serially computing a number, based on data contained in a data packet transmitted on a communications link. A sending device applies a 16- or 32-bit polynomial to a block of data that is to be transmitted and appends the resulting cyclic redundancy code to the block. The receiving end applies the same polynomial to the data and compares its result with the result appended by the sender. If the stored value is equal to the newly computed value, the data transmission is considered successful. If an error is detected, the receiver may notify the sender to resend the data packet.

Embodiments of the invention utilize Frame Checking Sequence (FCS) implementation for error checking. In a Frame Checking Sequence, a serial bit stream is transmitted, the FCS is calculated for the serial data as it goes out, and the complement of the resulting FCS is appended to the serial stream. When the receiver detects the end of the frame, it determines that it has finished calculating the received FCS. The FCS is designed so that a particular pattern results when the FCS operation passes over a binary complement of the FCS.

Embodiments of the invention utilize the 32 bits polynomial to compute the FCS, also abbreviated as FCS-32. The polynomial function is as follows:

$$FCS32 = x^0 + x^1 + x^2 + x^4 + x^5 + x^7 + x^8 + x^{10} + x^{11} + x^{12} + x^{16} + x^{22} + x^{23} + x^{26} + x^{32}$$

Embodiments of the invention use 32 bits at the end of the data packet 220 to hold the FCS-32. Embodiments of the invention also store a time stamp 240 having a size of 32 bits, starting from the twelfth byte before the end of the packet, and a time stamp binary complement 250, starting from the eighth byte before the end of the packet. These location designations are crucial to one embodiment of the invention described in further detail below. However, it is clear that other embodiments of the invention may be implemented using different topological configurations between the time data and the error checking data.

Figure 3:
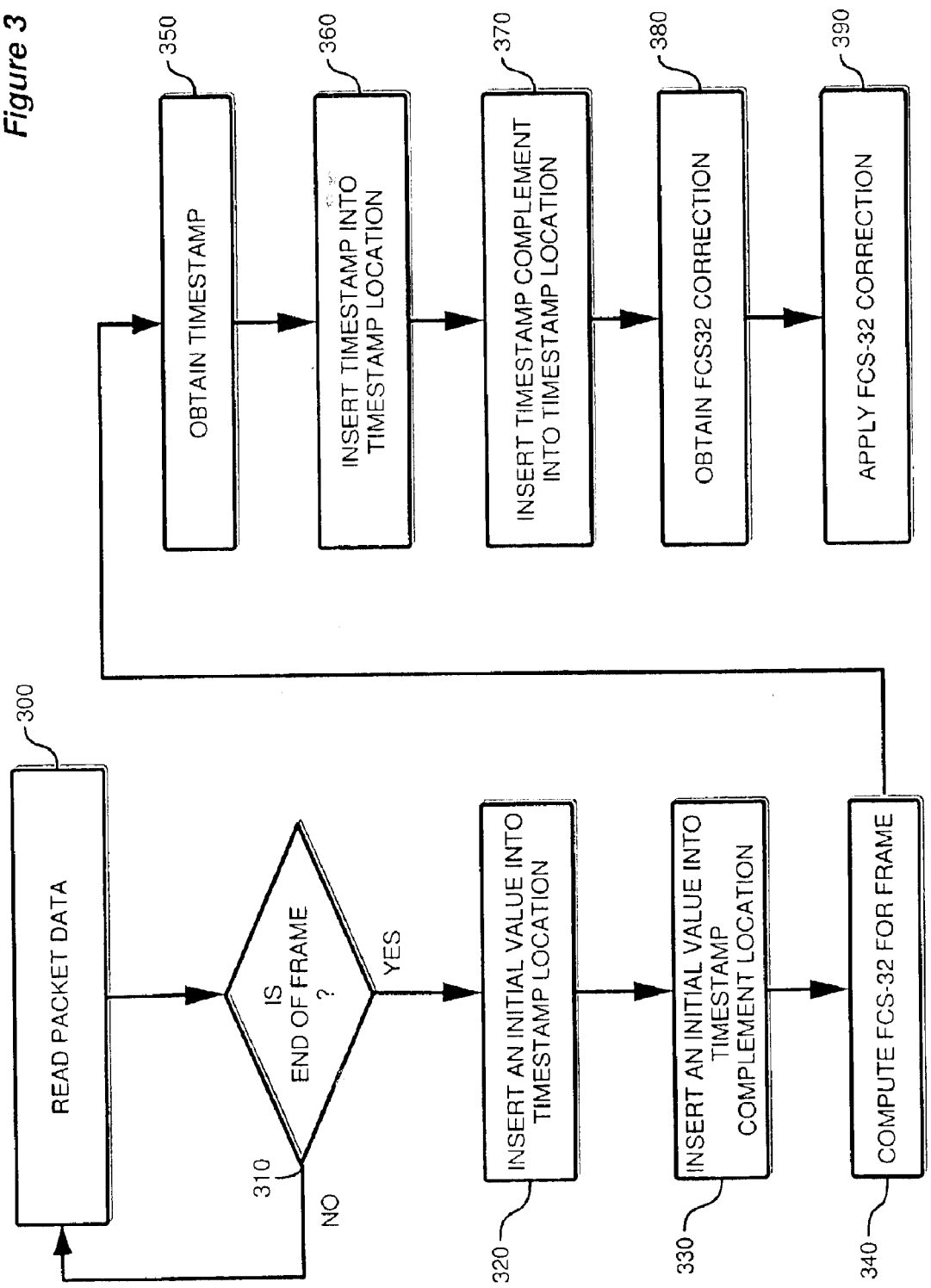
FIG. 3 is a flow diagram illustrating steps for data packet time stamping in accordance with embodiments of the invention.

FIG. 3 is a flow diagram illustrating steps for data packet time stamping in accordance with embodiments of the invention. At step 300, a data port receives data packets from a network. Typically, the data is stored in a random access memory as stacks of data. Stacks of data may have one of several ways of storing and retrieving data. For example, one type of stack of data allows the first elements stored in the stack to be withdrawn first, in which case the stack is called "first-in-first-out" (FIFO). Another type of stack of data allows first data elements to be retrieved last, in which case the stack is called "last-in-first-out" (LIFO).

Systems implementing the invention read data and check for a code indicating the end of a frame at step 310. When the end of the frame is encountered, embodiments of the invention insert an initial value in the time stamp location at step 320. In a preferred embodiment, the value inserted in the time stamp location is zero (0). However, other values may be used, depending on the type of computation performed in later steps of the invention. At step 330, embodiments of the invention insert an initial value into the time stamp complement location. In a preferred embodiment, the initial value is zero (0). However, other initial values may be used depending on the type of computation utilized in later steps of the method. At step 340, embodiments of the invention compute the cyclic redundancy checking and append it at the end of the data packet. In a preferred embodiment of the invention, shown in FIG. 3, the Frame Checking Sequence method is utilized. At step 350, embodiments of the invention obtain a time stamp. A time stamp may be obtained from a time reference such as an internal clock in a hardware system to implement the invention. The time source may also be external, or the internal clock may be synchronized with an outside time source.

At step 360, embodiments of the invention insert the time stamp, obtained at step 350, into a time stamp location in the data packet. At step 370, embodiments of the invention insert a complement of the time stamp into a complement time stamp location in the data packet. In embodiments of the invention, the specified location of insertion of the time stamp and its complement is relevant to the computation and correction algorithm of the cyclic redundancy checking performed on the data packet.

At step 380, embodiments of the invention obtain a cyclic redundancy checking correction. In a preferred embodiment of the invention, shown in FIG. 3, the Frame Checking Sequence method is used. In one embodiment of the invention, as stated above (FIG. 2), the time stamp location begins at the twelfth ($12^{th}$) byte (inclusive) before the end of the frame, and the location of the time stamp complement begins at the eighth ($8^{th}$) byte (inclusive) before the end of the frame. In the latter case the time stamp size and its complement are 4 bytes (32 bits) in size. In embodiments of the invention, the cyclic redundancy checking method utilized is the 32 bits Frame Checking Sequence (FCS-32) method. At first, the time stamp (and where applicable) its complement values are set a first initial value and a second initial value, respectively. For example, both first and second initial values may be set to zero (0). Once a time stamp (and eventually) its complement are inserted in the data packet, the value of the FCS-32 becomes erroneous. The error between the computed FCS-32 and the correct final value can be calculated since embodiments of the invention are aware of the time stamp value, its complement and their location in the data packet. The correction equations utilized to compute the final FCS-32 take into account the error introduced by setting the timestamp to the initial value.

In embodiments of the invention, the FCS equations are intended to compute the final FCS-32 after insertion of the timestamp. A module takes the 32-bit timestamp value itself, along with the FCS-32 of the frame, computed with the Timestamp Field being set to the initial value (e.g. zero) as input data. The module then computes the correct FCS-32 to be attached to the outgoing frame.

The equations may take into consideration certain constraints imposed by the computation protocol. For example, FCS individual bytes are transmitted in reverse order, meaning that the FCS bytes are transmitted from most to least significant bytes, contrary to the rest of data in the packet. Therefore, in order to compute the correct FCS, embodiments of the invention have equations that correct for anomalies introduced by previous calculation of the FCS.

Embodiments of the invention may obtain the correction values from a hardware device dedicated to executing the correction algorithm. In other embodiments, a computer program may be utilized to resolve the correction equations and provide the correction values.

Since the calculation of the correction values may last more than one clock cycle, embodiments of the invention may improve the time precision by always computing the correction values one or more steps ahead of the time source. This may be achieved, for example, by incrementing the time value obtained from the time source by a time interval equal to the time source's increment, then computing the correction value in anticipation of the next clock cycle. The next time displayed by the time source then corresponds to the correction value already in place. Both the time value and the error correction value are made available for application to the data packets.

At step 390, embodiments of the invention apply the correction value. Applying the correction depends on the algorithm used to compute the cyclic redundancy checking. In a preferred embodiment, systems embodying the invention perform an exclusive OR (XOR) operation involving the existing FCS-32 value and the correction value.

Figure 4:
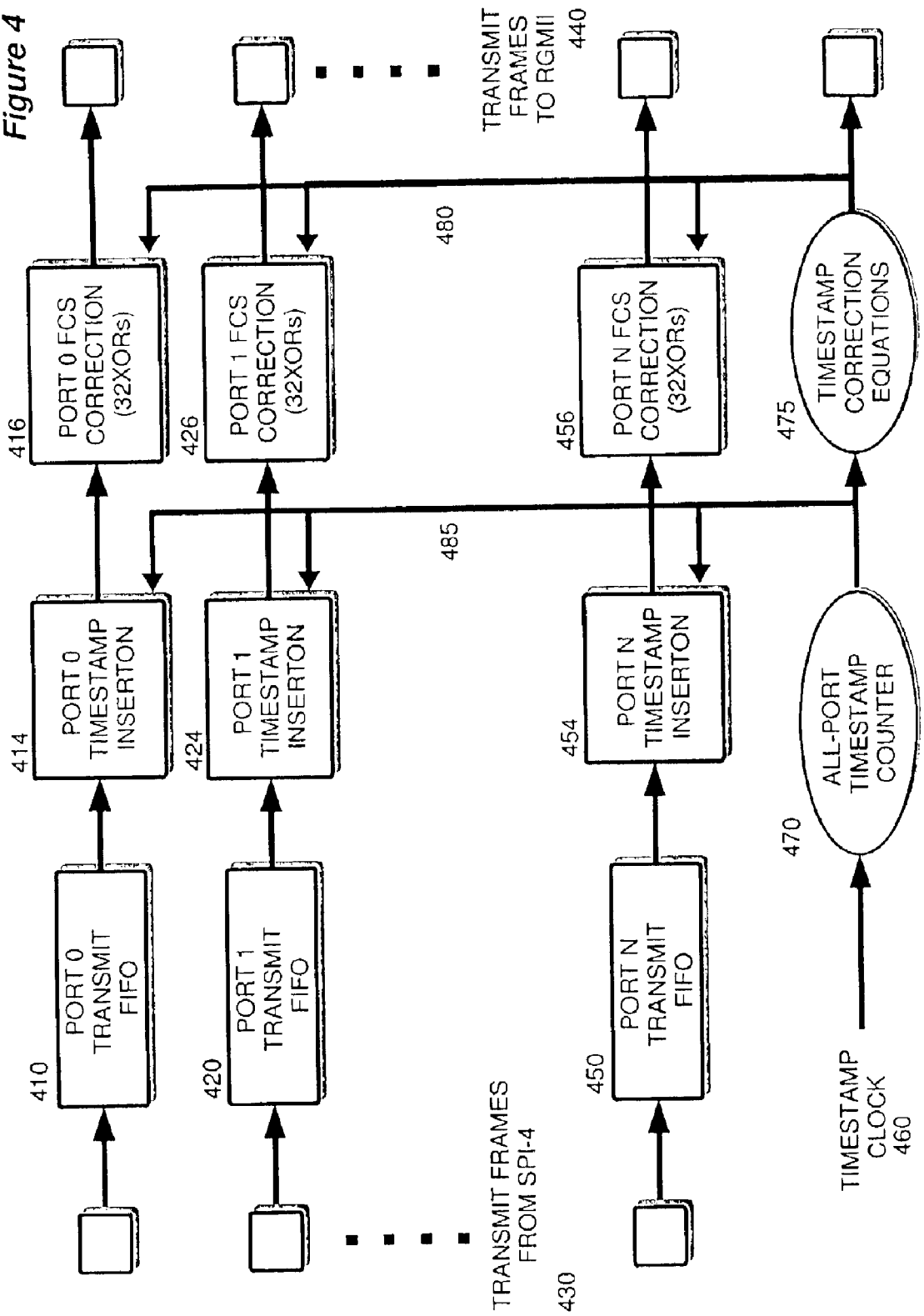
FIG. 4 is a block diagram illustrating system components for inserting a precision time stamp in accordance with embodiments of the invention.

FIG. 4 shows a block diagram illustrating system components for inserting a precision time stamp in accordance with embodiments of the invention. The system components illustrated in FIG. 4 are typically implemented in devices designed for testing the performance of network devices such as illustrated in FIG. 1. Systems embodying the invention typically have one or more physical ports for receiving and transmitting network data. Each port may comprise a network interface 430 for receiving data. For example, embodiments of the invention may utilize an interface based on a standard, such a System Packet Interface Level 4 Phase 2 (SPI-4), which is a high-speed interconnection for 10 Gigabits per second aggregate bandwidth applications (e.g., optical cable, 10 Gigabit per second Ethernet, etc.). In a typical network device, each port may send and receive multiple data streams. A data stream may comprise one or more data types, such as voice and video.

Systems implementing the invention typically implement a time source 460. A time source may comprise an internal clock directly communicating with other components of the system through a bus. The system may utilize registers, to keep and update the time, and utilize hardware and/or software to communicate with one or more external time sources. Embodiments of the invention implement one or more time counters 470 that keep an update of time. A time value is kept in the counter and is made available, through a bus, to other components of the system. Embodiments of the invention implement a processor for computing the timestamp correction equations using cyclic redundancy checking 475. In embodiments of the invention, the cyclic redundancy checking method is FCS-32, and the time stamp and its complement are located in the second and first slots, respectively, before the FCS-32 location. In embodiments of the invention a time stamp correction processor 475 has access to the time stamp stored in the all-port time stamp counter 470, and is enabled to communicate with other components in the system. The time stamp may be communicated to other component in the system though a communication bus 485, for example. The time stamp correction processor computes a correction term utilizing a set of equations, that allow correction of the cyclic redundancy checking, given a correct time stamp and an offset an initial value for the time stamp (e.g., zero). In embodiments of the invention, the correction term is communicated to other components in the system through a communication bus 480.

Systems embodying the invention typically store the data received through the interface in a first-in first-out (FIFO) buffer, indicated by 410, 420 and 450, where port 0 transmits FIFO at 410, port 1 transmits FIFO at step 420 and port N transmits FIFO at 450. One embodiment of the invention utilizes one or more buffers for each physical port. Other embodiments of the invention may utilize any configuration, such as multiplexed channels, of data buffers allowing the system to receive and process data. Embodiments of the invention implement one or more modules 414, 424 and 454 for inserting a time stamp into data packets, where port 0 inserts a time stamp at 414, port 1 inserts a time stamp at 424, and port N inserts a time stamp at 454. The time stamp insertion modules are enabled to access the time stamp held by the all port time stamp counter 470 in embodiments of the invention. The time stamp insertion modules, or a separate set of modules, also allow a system to compute and insert a complement of the time stamp.

Embodiments of the invention utilize one or more modules 416, 426 and 456, specialized in applying the cyclic redundancy checking correction to data packets. In FIG. 4, the port 0 FCS-32 correction (32XORs) is shown in 416, the port 1 FCS-32 correction (32XORs) is shown in 426 and the port N FCS-32 correction (32XORs) is shown in 456. These modules are referred to as cyclic redundancy checking correction modules. In embodiments of the invention, the cyclic redundancy checking correction modules are coupled with the time stamp correction equations. As described above in method steps 350 through 390, when a system implementing the invention detects the end of a data packet, it requests a time stamp and inserts the time stamp and its complement into the data packet, using the timestamp insertion module. The system then retrieves the cyclic redundancy checking correction values from the module specialized in executing the correction equations. The system embodying the invention applies the correction values to the data packet. In a preferred embodiment, the cyclic redundancy checking correction is an FCS-32 method and the initial time stamp value is zero (0). In the latter case, the correction value resulting from computing the correction equations is combined with the existing FCS-32 contained in the FCS-32 field using an exclusive-OR operation. An exclusive-OR operation is well known in the art of binary computation. In an exclusive-OR a binary (or bit-wise) operation between two values compares bits in homologous locations and produces a one (1) value when the bits values are different and a zero (0) value when the bits values are equal. The results of this procedure are packets that possess the correct cyclic redundancy checking correction value and a precise time stamp. Embodiments of the invention typical receive input data from an interface 430 such as System Packet Interface Level 4 Phase 2, which is a high-speed interconnection for 10 Gb/s aggregate bandwidth applications. System Packet Interface Level 4 Phase 2 provides for packet and cell transfer in applications such as optical cables data transfer and 10 Gb/s Ethernet. Embodiments of the invention typically output data through a network data output interface 440 (e.g., a Reduced Gigabit Media Independent Interface). Embodiments of the invention implement one or more computation modules, 410 through 426 and 450 through 475, utilizing field-programmable gate array (FPGA) technology. Field-programmable gate arrays are electronic modules that allow hardware instructions to be programmed, or re-programmed, into electronic devices post-manufacture. Other embodiments of the invention may be implemented using a central processing unit (CPU), coupled with a random access memory (RAM), to execute program code for inserting a time stamp into the data packets, computing the correction equations and applying the correction values to the data packets.

In conclusion, a method for time stamping data has been disclosed that comprises obtaining a data packet, inserting a first initial value at a first location in the data packet, inserting a second initial value at a second location in the data packet and then computing an error checking value attached to the data packet. As the packet data is being read from the FIFO, just prior to exiting the test equipment, a correct timestamp is obtained, a complement of the time stamp is calculated and a correction value using the time stamp and the complement of said time stamp is calculated. Next, the time stamp is inserted at the first location in the data packet and the complement of the time stamp is inserted at the second location in the data packet; and the correction value is then applied to the error checking value.

Thus, a method and apparatus for time stamping data packets has been demonstrated utilizing a system for inserting an initial controlled value in a location for holding a time stamp in data packets. The system computes an initial error correction value, and delays inserting the time stamp until the packet is about to be transmitted. The system then inserts a time stamp in the time stamp location, and utilizes a set of correction equations to compute a final error checking value that is attached to the packet in replacement of the existing error checking value.

The invention is not limited to the description herein. The claims however, and the full scope of their equivalents are what define the metes and bounds of the invention.

What is claimed is:

1. A method for time stamping data comprising:
   obtaining a data packet;
   inserting an initial value in said data packet in a time stamp location;
   computing a partial error checking value for attaching to said data packet;
   moving said data packet to an output layer for transmission;
   obtaining a time stamp;
   computing a final error checking value using said time stamp and said partial error checking value;
   inserting said time stamp at said time stamp location; and
   attaching said final error checking value in place of said partial error checking value.

2. The method of claim 1, wherein said obtaining said data packet further comprises reading data from a network interface.

3. The method of claim 1, wherein said obtaining said data packet further comprises reading data from an input data buffer of a network device.

4. The method of claim 1, wherein said moving said data packet further comprises writing said data packet to and reading said data from an output data buffer.

5. The method of claim 1, wherein said computing said final error checking value further comprises using a set of correction equations for computing each bit of said final error checking value.

6. A method for time stamping data comprising:

obtaining a data packet;

inserting a first initial value at a first location in said data packet;

inserting a second initial value at a second location in said data packet;

computing an error checking value attached to said data packet;

moving said data packet to an output layer for transmission;

obtaining a precision time stamp;

computing a complement of said time stamp;

computing a correction value using said time stamp and said complement of said time stamp;

inserting said time stamp at said first location in said data packet;

inserting said complement of said time stamp at said second location in said data packet; and applying said correction value to said error checking value.

7. The method in claim 6, wherein said obtaining said data packet further comprises reading data through a network interface.

8. The method in claim 7, wherein said obtaining said data packet further comprises reading a code indicating the end of said data packet.

9. The method in claim 6, wherein said first initial value further comprises the value zero.

10. The method in claim 6, wherein said second initial value further comprises the value zero.

11. The method in claim 6, wherein said computing said error checking value further comprises utilizing a polynomial function.

12. The method in claim 11, wherein said polynomial function further comprises the frame checking sequence standard polynomial function.

13. The method in claim 6, wherein said computing said error checking value further comprises performing an exclusive-OR operation using said first initial value and said second initial value.

14. The method in claim 6, wherein said obtaining said time stamp further comprises accessing a time stamp source through a communication bus.

15. The method in claim 6, wherein said computing said complement of said time stamp further comprises computing a value related to said time stamp using a transformation function.

16. The method in claim 15, wherein said computing said value related to said time stamp further comprises computing a binary complement of said time stamp.

17. The method in claim 6, wherein said computing said correction value further comprises utilizing a set of correction equations.

18. The method in claim 6, wherein said applying said correction value further comprises performing a binary operation between said error checking value and said correction value.

19. The method in claim 18, wherein said binary operation further comprises an exclusive-OR operation.

20. An apparatus for time stamping data comprising:

a hardware element configured to obtain a data packet;

said hardware element inserting a first initial value at a first location in said data packet;

said hardware element inserting a second initial value at a second location in said data packet;

said hardware element computing an error checking value attached to said data packet;

said hardware element obtaining a time stamp value;

said hardware element computing a complement of said time stamp;

said hardware element computing a correction value using said time stamp and said complement of said time stamp;

said hardware element inserting said time stamp at said first location in said data packet;

said hardware element inserting said complement of said time stamp at said second location in said data packet; and said hardware element applying said correction value to said error checking value.

21. The apparatus in claim 20, wherein said hardware element further comprises a plurality of hardware components.

22. The apparatus in claim 21, wherein said plurality of hardware components further comprise a plurality of filed-programmable gate arrays components.

23. The apparatus in claim 20, wherein said hardware element is further configured to read a code indicating the end of said data packet.

24. The apparatus in claim 20, wherein said hardware element is further configured to utilize a polynomial function.

25. The apparatus in claim 24, wherein hardware element is further configured to compute said error check utilizing the frame checking sequence standard polynomial function.

26. The apparatus in claim 25, wherein hardware element is further configured to perform an exclusive-OR operation using said fist initial value and said second initial value.

27. The apparatus in claim 25, wherein said hardware element further comprises a hardware component for providing a time stamp.

28. The apparatus in claim 20, wherein said hardware component for providing said time stamp is further coupled to a bus for communicating said time stamp.

29. The apparatus in claim 20, wherein said hardware element further comprises a hardware component configured to compute a value related to said time stamp using a transformation function.

30. The apparatus in claim 29, wherein said hardware component is further configured to compute a binary complement of said time stamp.

31. The apparatus in claim 20, wherein said hardware element further comprises a hardware component configured to compute said correction value utilizing a set of correction equations.

32. The apparatus in claim 20, wherein hardware element further comprises a hardware component configured to apply said correction value by performing a binary operation between said error checking value and said correction value.

33. The apparatus in claim 32, wherein hardware component is further configured to perform an exclusive-OR operation.

\* \* \* \* \*